(12) United States Patent
Doberenz

(10) Patent No.: US 6,486,484 B1
(45) Date of Patent: Nov. 26, 2002

(54) PULSED OPTICAL COUPLERS

(75) Inventor: Philip W. Doberenz, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/465,628

(22) Filed: Dec. 17, 1999

(51) Int. Cl.[7] .............................................. G02B 27/00
(52) U.S. Cl. ...................................................... 250/551
(58) Field of Search ............................ 250/551, 214 R, 250/214 LS, 214 B, 205, 221

(56) References Cited

U.S. PATENT DOCUMENTS

| | | | |
|---|---|---|---|
| 3,648,051 A | * 3/1972 | Weckler | 250/214 R |
| 3,816,745 A | * 6/1974 | Primm et al. | 250/221 |
| 4,810,937 A | * 3/1989 | Havel | 315/152 |
| 4,847,873 A | * 7/1989 | Kuwaoka et al. | 375/346 |
| 5,384,457 A | 1/1995 | Sommer | 250/214 R |

* cited by examiner

Primary Examiner—Frank G. Font
Assistant Examiner—Thanh X. Luu
(74) Attorney, Agent, or Firm—Trop, Pruner & Hu, P.C.

(57) ABSTRACT

A pulsed photoemitter circuit may be arranged to expose a pulsed photodetector circuit. Both the photoemitter and the photodetector circuits may be exposed to a pulsed signal which may be effective to improve the response time of the photoemitter/detector pair. In one embodiment of the present invention, the phototransistor load is coupled to a photoemitter control signal.

8 Claims, 7 Drawing Sheets

PULSED OPTICAL COUPLERS

BACKGROUND

This invention relates generally to optical couplers including a photoemitter/detector pair.

Commonly, a photoemitter is aligned with a photodetector in an optical coupler to detect the imposition of an object between the photoemitter/detector pair. For example, a shutter may open or close between the pair and this may be detected by emission from the photoemitter that is detected (or not) by the photodetector.

The photoemitter may be a light emitting diode (LED) which emits light in the visible or infrared spectrum. The photodetector may conventionally be a phototransistor. Commonly, such photoemitter/detector pairs are used in connection with a mouse cursor control device in a computer system. One type of mouse is utilized in connection with wireless systems. In such cases, the wireless mouse may include its own internal battery. Thus, the need for a low power photoemitter/detector pair may be particularly acute in such applications.

Techniques have been developed to decrease the power dissipation of the photoemitter/detector pairs. One such technique is to pulse the LED. Pulsing the LED may reduce power consumption but it also may be adversely affected by the parasitic capacitance of the photodetector.

Another technique for reducing the power consumption of the phototransistor is to increase the value of its load resistor. However, this approach may slow down the response time of the phototransistor.

Thus, there is a continuing need for better ways to reduce the power consumption of photoemitter/detector pairs.

SUMMARY

In accordance with one aspect of the present invention, a photodetector circuit may include a pulsed photodetector device. A load is coupled to the photodetector device.

Other aspects are set forth in the accompanying detailed description and claims.

DETAILED DESCRIPTION

Figure 1A:
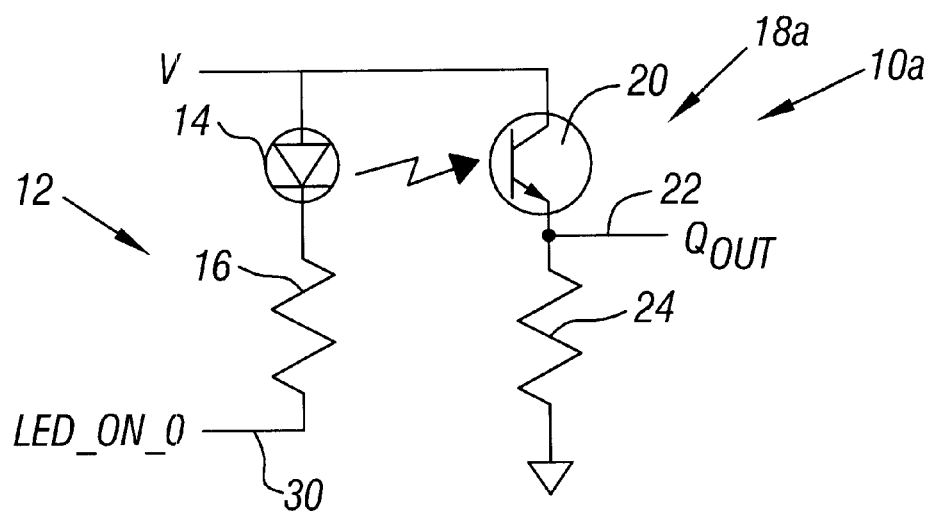
FIG. 1A is a circuit diagram in accordance with the prior art.
Figure 1B:
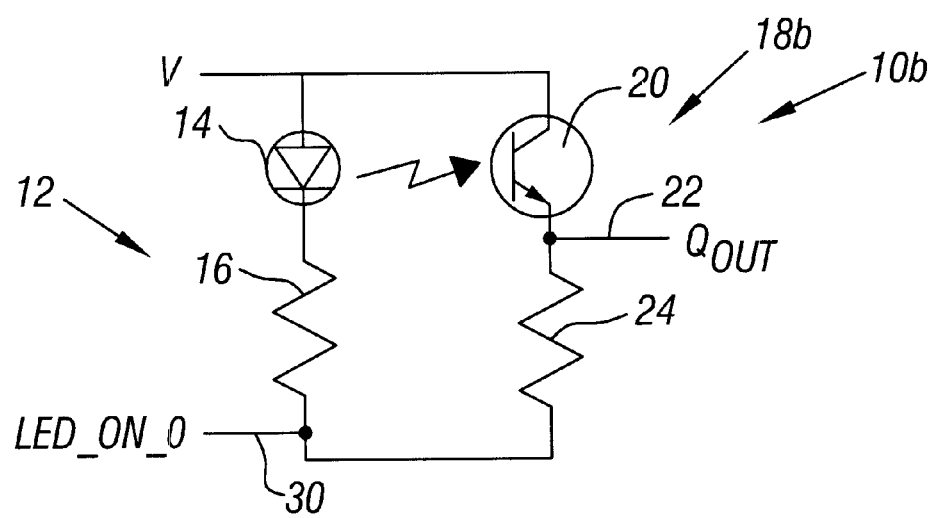
FIG. 1B is a circuit diagram of one embodiment of the present invention.

Referring to FIGS. 1A and 1B, a photoemitter circuit 12 may include a photoemitter 14 such as a light emitting diode (LED) and a current limiting resistor 16. The circuit 12 is arranged in opposition to a photodetector circuit 18a or 18b. The circuits 18a and 18b include a photodetector 20, such as a phototransistor, and a load resistor 24. The photoemitter 14 may emit light in the visible or infrared spectrum. The anode of the photoemitter 14 and the collector of the photodetector 20 are connected to a supply voltage, indicated as "V", in one embodiment of the invention.

Figure 2:
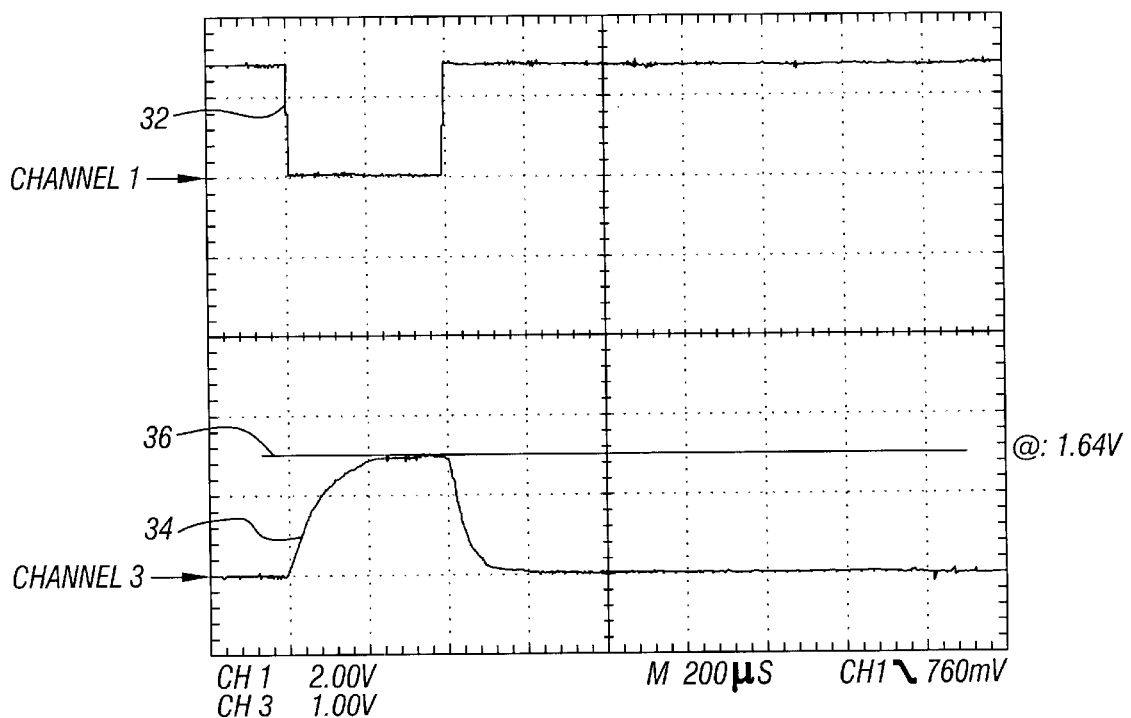
FIG. 2 is an oscilloscope trace of the output voltage of a photodetector in accordance with a prior art embodiment.

A repetitive, negatively pulsed signal 32, indicated as LED_ON_0 in FIG. 2, is coupled to a node 30. In FIG. 1A, the photodetector circuit 18a is not pulsed and is connected to ground. In FIG. 1B the photodetector circuit 18b is continuously pulsed through a connection to the node 30. However, the circuits 12 and 18b may be separated and separately coupled each to its own supply voltage and enabling signals enabled concurrently, in some embodiments of the present invention.

The output voltage (Qout) 22 of each photodetector circuit 18 may be measured across the load resister 24. One terminal of the load resistor 24 is coupled to the emitter of the photodetector 20, which may be a bipolar phototransistor, and the other terminal is coupled to the pulsed signal 30. Tying the phototransistor load resistor 24 to the pulsed signal may result in faster response time which can save power by allowing a lower duty cycle circuit 18b.

In one illustrative embodiment of the present invention, the current limiting resistor 16 may be 300 ohms, and the load resistor 24 may be 12 kilohms. The pulsed signal LED_ON_0, waveform 32, may be a negatively pulsing repetitive signal with an on time of 10 microseconds or less and an off period as long as 2 milliseconds without significant voltage drift in one embodiment of the present invention. For example, the signal 32 may be negatively pulsing repetitive signal that has a minimum of 0 volts and a positive maximum illustrated as 3 volts in one embodiment of the invention.

As a result of the application of the pulsed signal LED_ON_0 (waveform 32) to the current limiting resistor 16, the output voltage (Qout) of the circuit 10a, shown in FIG. 1A, has the waveform 34 shown in FIG. 2 with the grounded photodetector circuit 18a. Thus, in the illustrated embodiment, the output voltage 34 of the photodetector circuit 18a rises when the photoemitter 14 is pulsed to produce light. Eventually the output 22 reaches the voltage level 36, after about 400 microseconds in one example.

Figure 3:
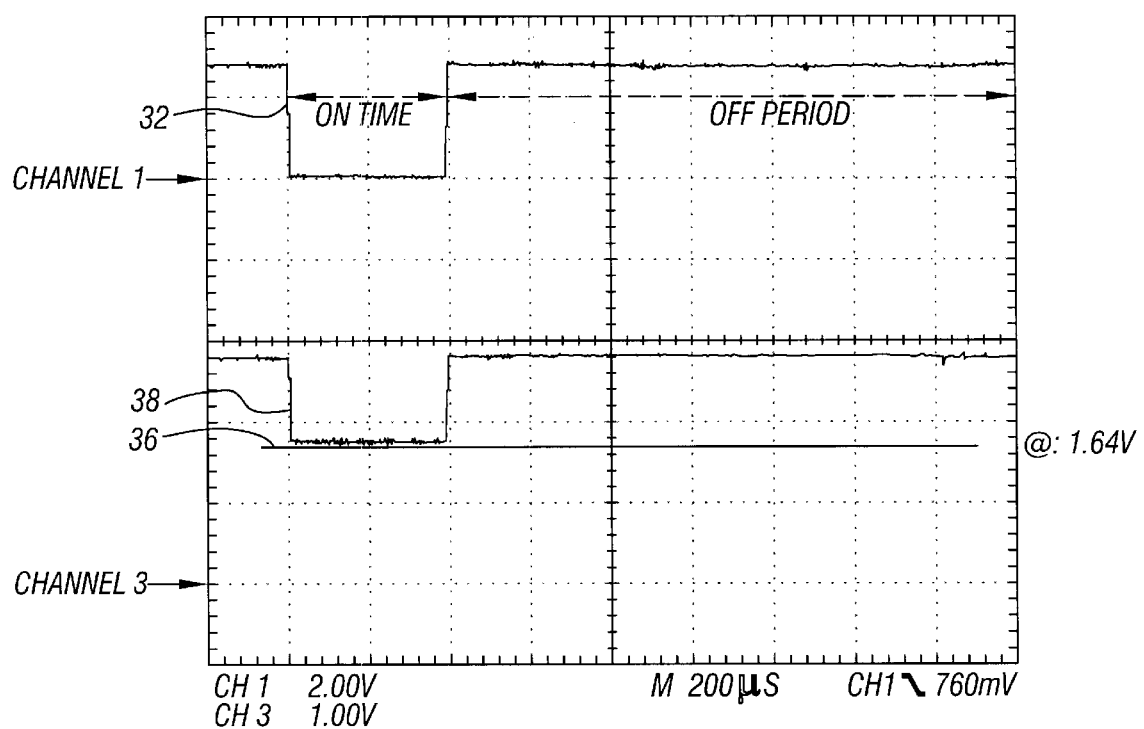
FIG. 3 is an oscilloscope trace of the output voltage of a photodetector in accordance with one embodiment of the present invention.

In contrast, with the circuit 10a of FIG. 1A, the photodetector circuit 18b, coupled to the node 30, is pulsed and the voltage (Qout) reaches the level 36, shown in FIG. 3, in one embodiment of the invention. The output voltage (Qout) 38 starts at the approximate level 36 that would have eventually reached if it were allowed to continue to rise with the grounded connection (FIG. 2). The output voltage 38 starts out at the level 36 because it picks up where it left off with the previous pulse of the continuous pulse stream.

Figure 4:
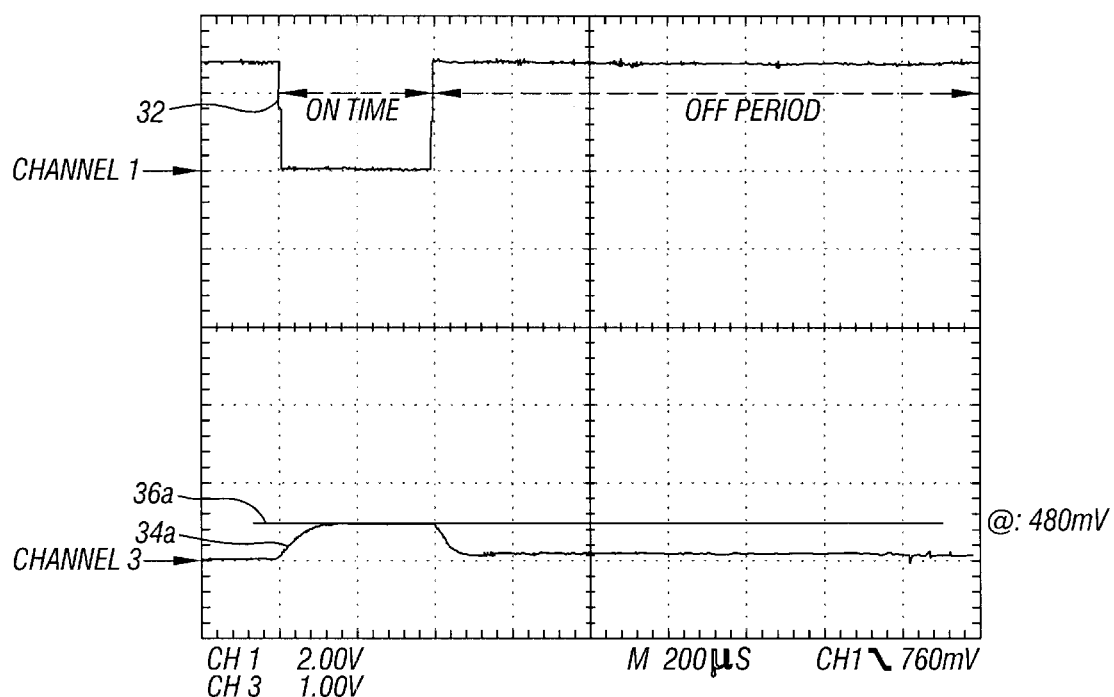
FIG. 4 is an oscilloscope trace in accordance with an embodiment of the prior art.

Referring to FIG. 4, the light output from the photoemitter 14 may be partially blocked from the photodetector 20. In such case, the output voltage 34a, for the unpulsed photodetector 18a, does not rise as much as was illustrated in FIG. 2. Instead, the output voltage 34a reaches a maximum level 36a.

Figure 5:
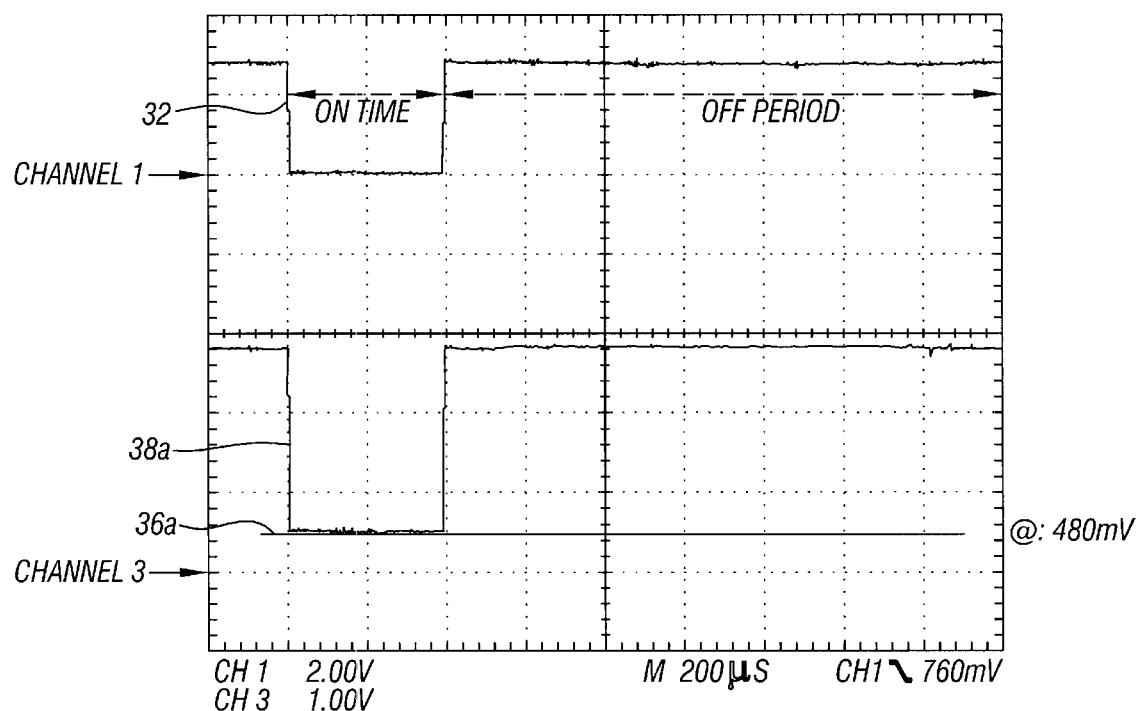
FIG. 5 is an oscilloscope trace in accordance with one embodiment of the present invention.

In the circuit 10b with the load 24 tied to the pulsed signal LED_ON_0, the output voltage 38a starts out approximately at the level 36a of the unpulsed example, as shown in FIG. 5.

Figure 6:
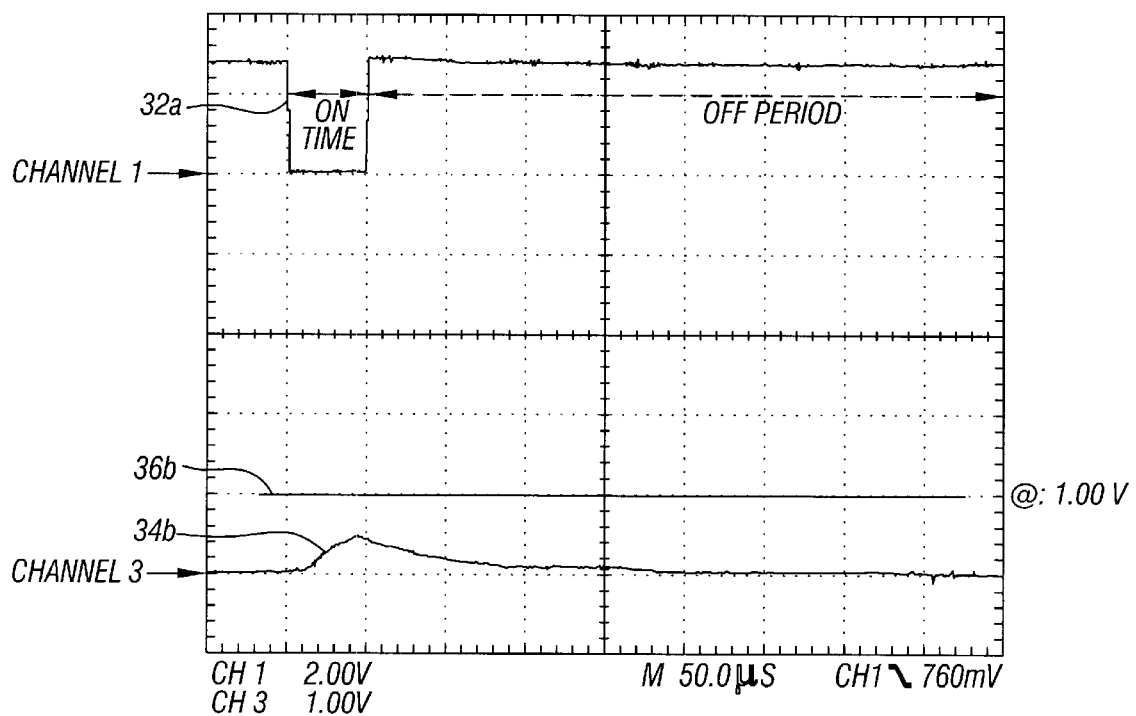
FIG. 6 is an oscilloscope trace in accordance with the prior art.

Turning next to FIG. 6, a shorter pulse 32a replaces the pulse 32. In contrast to the prior examples, the pulses 32a are shortened to 50 microseconds from 400 microseconds. In this case, the output voltage (Qout), with the load resistor 24 connected to ground, is as indicated at 34b. The characteristics of the signal 34b suggest that the rise time is not fast enough, given the shortened pulse width.

Figure 7:
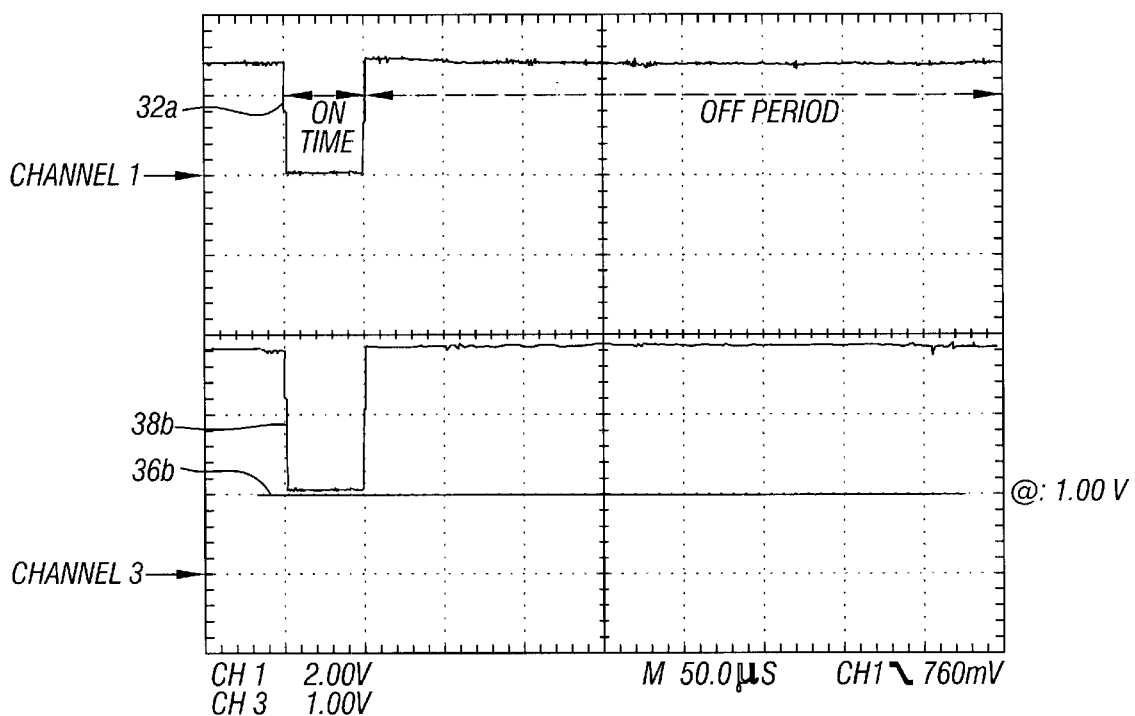
FIG. 7 is an oscilloscope trace in accordance with one embodiment of the present invention.

Again in contrast, with the shortened width pulse 32a and the circuit 18b, connected to the node 30, an effective output signal 38b is produced, as shown in FIG. 7.

Thus, pulsing both the photoemitter and the phototransistor circuits 12 and 18b results in a faster response which may save power by allowing a lower duty cycle circuit.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An optical coupler comprising:

a photoemitter circuit to provide photoemissions; and a photodetector circuit electrically coupled to said photoemitter circuit to provide an output at a level, wherein said photoemitter and photodetector circuits are pulsed by a repetitive negatively pulsing signal to detect the photoemissions from said photoemitter circuit, each pulse of said repetitive negatively pulsing signal to restart the output from the photodetector circuit at the level reached in the output of a previous pulse.

2. The coupler of claim 1, said photoemitter circuit including a photoemitter and a current limiting resistor for said photoemitter.

3. The coupler of claim 2 wherein said photodetector circuit includes a photodetector and a load resistor for said photodetector.

4. The coupler of claim 3 where said photoemitter is a light emitting diode and said photodetector is a phototransistor.

5. The coupler of claim 4 wherein the anode of said diode and the collector of said phototransistor are coupled to a common power supply voltage.

6. The coupler of claim 1 wherein said each pulse of said repetitive negatively pulsing signal including an "ON" time substantially shorter than an "OFF" period to enable a low duty cycle.

7. A method comprising:

providing a photoemitter circuit to emit energy;

electrically coupling a photodetector circuit to said photoemitter circuit to provide an output at a level; and using a repetitive negatively pulsing signal to pulse said photoemitter circuit and said photodetector circuit to detect said energy, each pulse of said repetitive negatively pulsing signal to restart the output from the photodetector circuit at the level reached in the previous pulse.

8. The method of claim 7 wherein said each pulse of said repetitive negatively pulsing signal including an "ON" time substantially shorter than an "OFF" period to enable a low duty cycle.

* * * * *